(12) United States Patent
Crevasse et al.

(10) Patent No.: US 6,579,797 B1
(45) Date of Patent: Jun. 17, 2003

(54) CLEANING BRUSH CONDITIONING APPARATUS

(75) Inventors: Annette M. Crevasse, Orlando, FL (US); William G. Easter, Orlando, FL (US); John A. Maze, Orlando, FL (US); Frank Miceli, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/490,912

(22) Filed: Jan. 25, 2000

(51) Int. Cl.[7] .............................................. H01L 21/461
(52) U.S. Cl. ..................... 438/690; 438/691; 438/692; 438/706; 438/745
(58) Field of Search .............................. 438/690, 691, 438/692, 706, 745

(56) References Cited

U.S. PATENT DOCUMENTS

| | | | | |
|---|---|---|---|---|
| 5,650,039 A | * | 7/1997 | Talieh | 216/89 |
| 5,785,585 A | * | 7/1998 | Manfredi et al. | 451/285 |
| 6,004,196 A | * | 12/1999 | Doan et al. | 451/443 |
| 6,086,460 A | * | 7/2000 | Labunsky et al. | 451/56 |
| 6,106,369 A | * | 8/2000 | Konishi et al. | 451/41 |
| 6,270,396 B1 | * | 8/2001 | Uchiyama | 451/56 |
| 6,306,019 B1 | * | 10/2001 | Finkelman | 451/56 |
| 6,488,573 B1 | * | 12/2002 | Kobayashi et al. | 451/285 |
| 2002/0119613 A1 | * | 8/2002 | Yang et al. | 438/200 |

OTHER PUBLICATIONS

Wolf, S. and Tauber, R.N., "Silicon Processing for the VLSI Era", vol. 1, pp. 23–25.*

* cited by examiner

Primary Examiner—Benjamin L. Utech
Assistant Examiner—Vanessa Perez-Ramos

(57) ABSTRACT

The present invention provides a method of manufacturing an integrated circuit using a cleaning brush and a cleaning brush conditioning apparatus. In one embodiment, the cleaning brush conditioning apparatus comprises a conditioning bar and a load cell coupled to the conditioning bar. The load cell is configured to force the conditioning bar against the cleaning brush.

9 Claims, 4 Drawing Sheets

CLEANING BRUSH CONDITIONING APPARATUS

TECHNICAL FIELD OF THE INVENTION

The present invention is directed, in general, to a wafer cleaning apparatus and, more specifically, to an apparatus and method for maintaining semiconductor wafer cleaning brushes in a state of readiness for wafer cleaning.

BACKGROUND OF THE INVENTION

During semiconductor manufacturing, several processes create debris that is best removed by mechanical means, specifically, after silicon polishing, laser scribing and chemical/mechanical polishing. Silicon polishing is performed after a silicon ingot is cut into wafers to prepare the wafers for further precessing. Laser scribing is the process by which identifying numbers are scribed into the wafer, and chemical/mechanical polishing uses an abrasive slurry to planarize the wafer surface. Each of these processes creates debris that may cling to the wafer surface and present a potential contamination hazard. With the high cost of semiconductor manufacturing and intense competition among manufacturers, every effort must be made to minimize any contamination hazard.

Following these processes, the surfaces of the semiconductor wafer are best cleaned of any residual debris by passing the wafer between two rollers equipped with polyvinyl alcohol (PVA) brushes. While ammonium hydroxide or dilute hydrofluoric acid is used for semiconductor wafer cleaning the PVA brushes may also be kept wetted with de-ionized water to provide the high quality surface necessary for removing debris. While in use, the combination of brush rotation and pressure applied to the semiconductor wafer through the brushes flexes the PVA material and keeps the brushes in proper condition for cleaning additional wafers.

However, the brushes are idle when there are no wafers being cleaned and, as a consequence, the brushes lose their resilience, thereby suffering a loss of particle removal efficiency. Therefore, before the brushes may be used on production-quality wafers, "dummy" or warmup wafers, i.e., wafers that will not be used to produce commercially useable chips, are run through the cleaners to condition the PVA brushes and restore their resilience. As few as 10 percent to as many as 20 percent of the wafers in small lots passing through the cleaner may be dummy wafers. Of course, this requires machine time, manpower, and additional chemicals to restore the brushes resilience, factors that would better be spent on wafer production and that ultimately increase the costs of production of semiconductor wafers and chips.

Accordingly, what is needed in the art is an apparatus and method that requires minimal to no investment of technical manpower for maintaining cleaning brushes in a virtually constant state of readiness to clean semiconductor wafers.

SUMMARY OF THE INVENTION

To address the above-discussed deficiencies of the prior art, the present invention provides a method of manufacturing an integrated circuit using a cleaning brush and a cleaning brush conditioning apparatus. In one embodiment, the cleaning brush conditioning apparatus comprises a conditioning bar and a load cell coupled to the conditioning bar. The load cell is configured to force the conditioning bar against the cleaning brush.

In another embodiment, the conditioning bar is cylindrical and has a longitudinal axis and the conditioning bar is capable of rotating about the longitudinal axis. The conditioning bar, in other embodiments, may comprise a surface material of TEFLON® (i.e., synthetic resinous fluorine), silicon, silicon nitride, ceramic, or silicon carbide. In a particularly advantageous embodiment, the cleaning brush is a semiconductor wafer cleaning brush.

In an alternative embodiment, the cleaning brush conditioning apparatus further comprises a dispenser containing a cleaning agent. The dispenser is coupled to the conditioning bar and configured to deliver the cleaning agent to the cleaning brush. In a further aspect, the cleaning agent may be deionized water, ammonium hydroxide, dilute hydrofluoric acid, other suitable chemical solvents, or surfactants.

The cleaning brush conditioning apparatus, in another embodiment, may further comprise a resiliency or indentation sensor coupled to the cleaning brush and configured to sense a resiliency of the cleaning brush, and a controller coupled to the load cell and to the resiliency sensor. The controller is configured to activate the load cell when the resiliency is less than a nominal resiliency. In yet another embodiment, the load cell is capable of applying a variable force.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
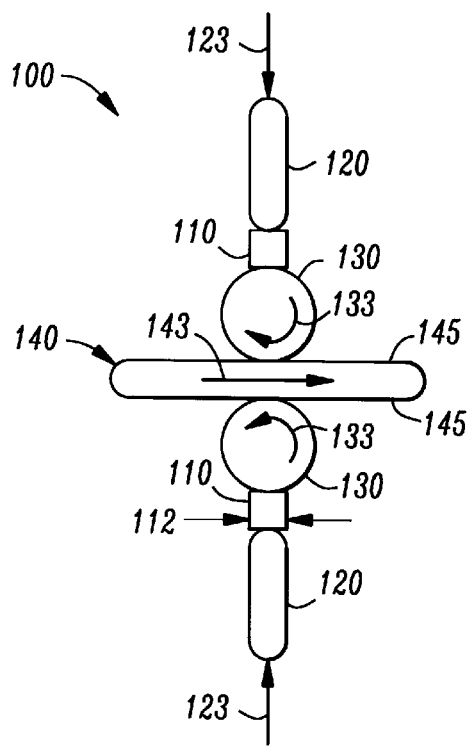
FIGS. 1A and 1B illustrate end and side views of one embodiment of a cleaning brush conditioning apparatus constructed according to the principles of the present invention.
Figure 1B:
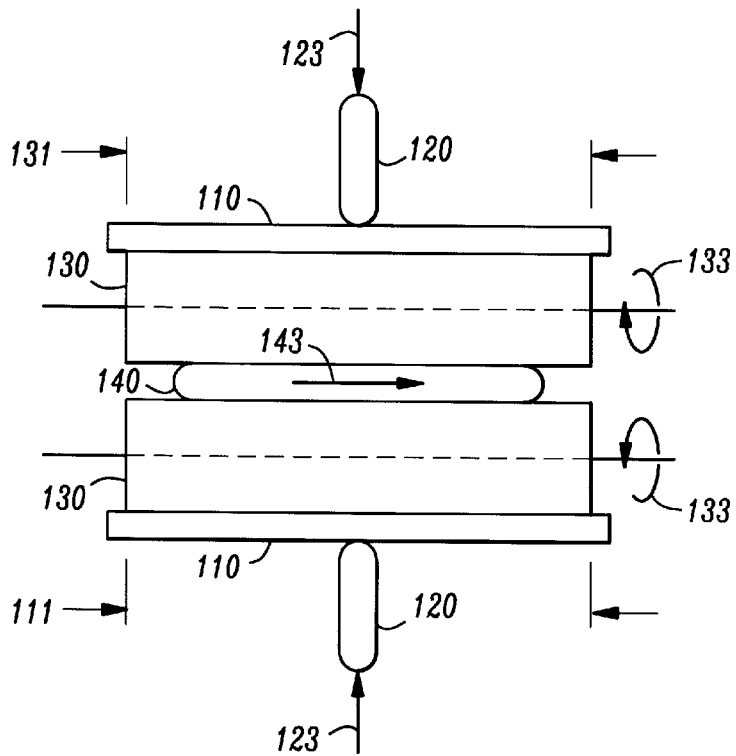

Referring initially to FIGS. 1A and 1B, illustrated are end and side views of one embodiment of a cleaning brush conditioning apparatus 100 constructed according to the principles of the present invention. The cleaning brush conditioning apparatus 100 comprises conditioning bars 110 and load cells 120 coupled to the conditioning bars 110. The conditioning bars 110 are shown proximate cleaning brushes 130 that may be comprised of polyvinyl alcohol (PVA) and used to clean the surfaces 145 of a semiconductor wafer 140. In the illustrated embodiment, the conditioning bars 110 are rectangular in cross section and of a sufficient length 111 to extend along the length 131 of the cleaning brushes 130 and of sufficient width 112 to assure proper brush 130 rotation. Of course, one who is skilled in the art will readily conceive of other shapes possessing advantages for specific brushes. The cleaning brushes 130 rotate as indicated at arrows 133 while the load cells 120 exert forces 123 on the conditioning bars 110 and against the cleaning brushes 130. The semiconductor wafer 140 may also be rotated as shown at 143. For the purposes of this discussion, the term "load cell" includes mechanical, i.e. springs, levers, etc., hydraulic, or pneumatic devices. One who is skilled in the art will readily conceive of a variety of such devices capable of providing the necessary forces 123.

Figure 2A:
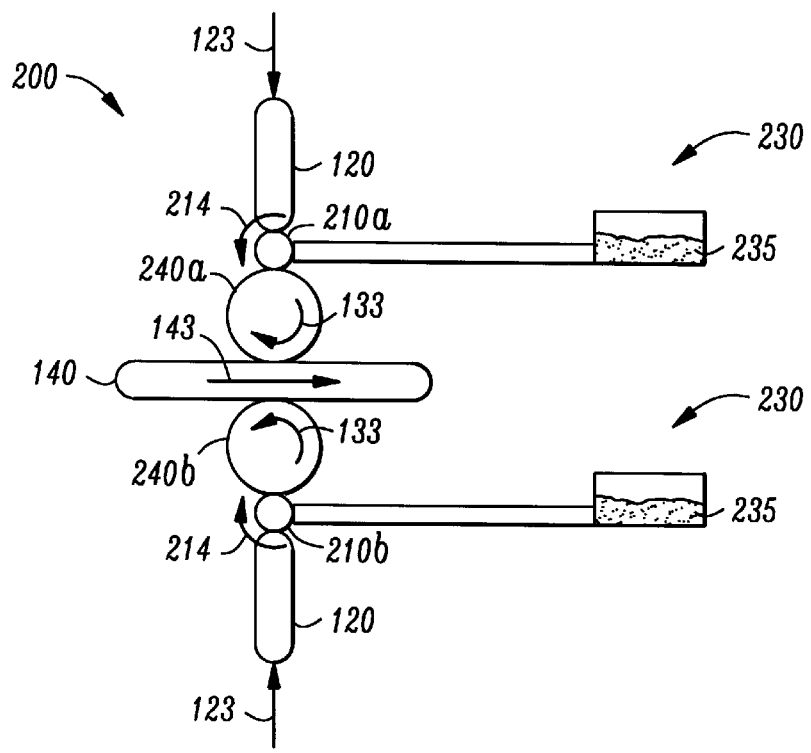
FIGS. 2A and 2B illustrate end and side views of an alternative embodiment of the cleaning brush conditioning apparatus of FIGS. 1A and 1B.
Figure 2B:
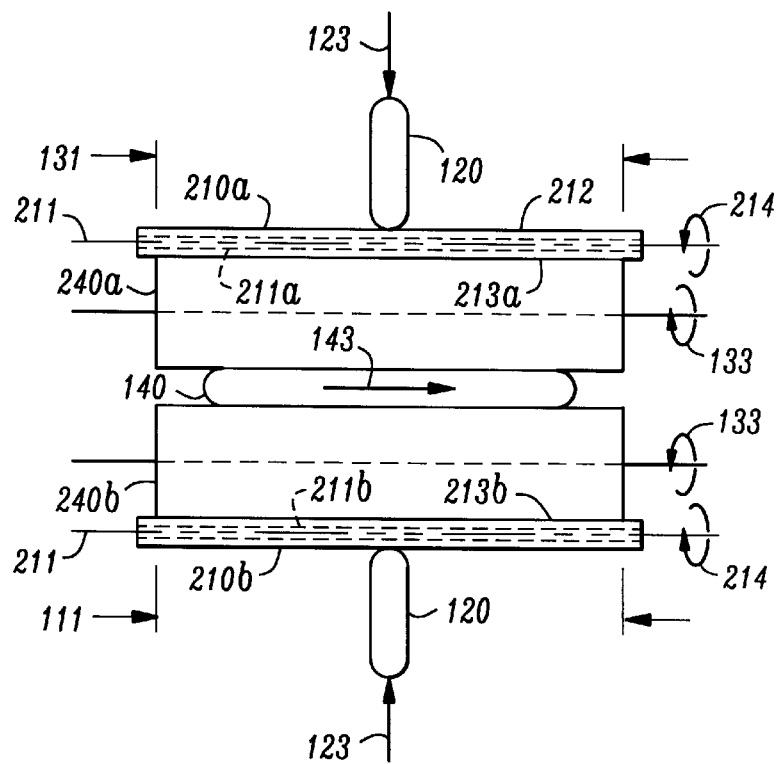

Referring now to FIGS. 2A and 2B, illustrated are end and side views of an alternative embodiment 200 of the cleaning brush conditioning apparatus 100 of FIGS. 1A and 1B. In this embodiment, the cleaning brush conditioning apparatus 200 comprises conditioning bars 210a, 210b (collectively referred to as 210), load cells 120, and dispensers 230 containing a cleaning agent 235 proximate cleaning brushes 240a, 240b (collectively referred to as 240) and the semiconductor wafer 140. The conditioning bars 210 are cylindrical in shape, and mounted on their longitudinal axes 211 so as to revolve during conditioning. The conditioning bars 210 may comprise a surface material 212 of tetrafluoroethylene silicon nitride, ceramics, or silicon carbide. Tetrafluoroethylene is known as TEFLON®, which is a trademark of Dupont Corporation. Of course, other materials may also be advantageously employed.

The dispensers 230 are individually coupled to the conditioning bars 210 and configured to deliver the cleaning agent 235 to the cleaning brushes 240. In one embodiment, the cleaning agent 235 may be delivered by gravity to a surface 213a of the conditioning bar 210a and to the cleaning brush 240a. The cleaning agent 235 may be deionized water, ammonium hydroxide, or dilute hydrofluoric acid. Of course, the exact cleaning agent 235 must be chosen by considering the debris expected and the production stage of the semiconductor wafer 140, even to including a surfactant. The cleaning agent 235 may be delivered by pressure to a surface 213b of the conditioning bar 210b and to the cleaning brush 240b. In one embodiment, the cleaning agent 235 may be pumped through a hollow core 211a of the conditioning bar 210a. Alternatively, the cleaning agent 235 may be sprayed (not shown) onto surfaces 213. The choice of cleaning agent delivery system will be governed by factors such as the material of the brushes, the location of the brushes, the composition of the cleaning agent, etc.

To condition the cleaning brushes 240, cleaning agent 235 is delivered to the conditioning bars 210, and the bars 210 are rotated 214 as shown. The semiconductor wafer 140 may also be rotated 143 or may simply be passed between the brushes 240. Forces 123 are exerted by the load cells 120 to continually flex the brushes 240, thereby causing the PVA, or other similar material, to be alternatively compressed and relaxed, thereby preventing the PVA from hardening.

Figure 3A:
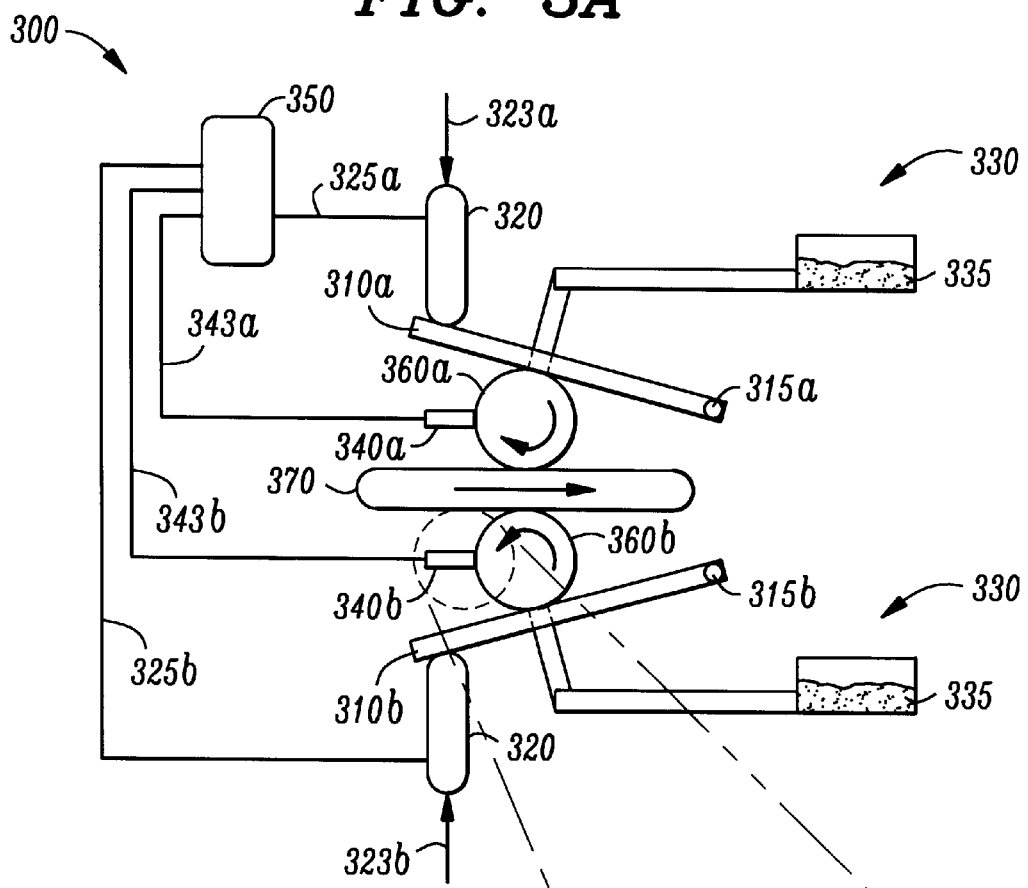
FIG. 3A illustrates an end view of a second alternative embodiment of the cleaning brush conditioning apparatus of FIGS. 1A and 1B.

Referring now to FIG. 3A, illustrated is an end view of a second alternative embodiment 300 of the cleaning brush conditioning apparatus of FIGS. 1A and 1B. In this embodiment, the cleaning brush conditioning apparatus 300 comprises conditioning bars 310a, 310b (collectively referred to as 310), load cells 320, a dispenser 330 containing a cleaning agent 335, a resiliency sensors 340a, 340b (collectively referred to as 340), and a controller 350. One who is skilled in the art will readily observe that the conditioning bars 310 are most effectively conditioning plates 310 that extend beyond the length (not visible) of the cleaning brushes, collectively 360, in this embodiment. The conditioning plates 310 rotate about pivots 315a, 315b. The cleaning brush conditioning apparatus 300 is proximate cleaning brushes 360a, 360b, and a semiconductor wafer 370. The dispensers 330 deliver the cleaning agent 335 to the cleaning brushes 360 as described above.

Figure 3B:
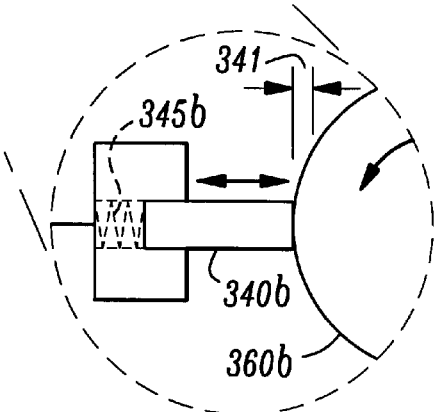
FIG. 3B illustrates an enlarged view of the resiliency sensor and cleaning brush of FIG. 3A.

Referring now to FIG. 3B, illustrated is an enlarged view of the resiliency sensor 340b and cleaning brush 360b of FIG. 3A. The resiliency sensors 340 are in contact with the cleaning brushes 360, respectively, and are configured to sense a resiliency of the cleaning brushes 360. The resiliency may be measured by sensing a deflection 341 of the sensor 340 as the cleaning brushes 360 are rotated. The sensor 340b is under pressure from spring 345b that exerts a minimal force to ensure continuous contact with the cleaning brush 345b. Of course, the sensors 340 may alternatively be configured to intermittently contact the brushes 360, thereby taking periodic readings. Less resilient brushes 360, e.g., as the brushes harden, cause the sensor 340 to deflect less than resilient brushes from a position of first contact. The deflection 341 of the sensor 340 is then sent to the controller 350 via sensing loops 343a, 343b. The controller 350, in turn, directs the load cells 320 via feedback loops 325a, 325b to cause greater forces 323 to be applied by the load cells 320 when the resiliency is less than a nominal resiliency. Nominal resiliency may be defined as a deflection of n mm for a particular resiliency sensor 340, where n may be empirically determined from cleaning brushes 360 that exhibit an acceptable particle removal efficiency. Of course, the controller 350 may be coupled to the load cells 320 and may also adjust the amount of force 323 exerted by the load cells 320, that is, the amount of force 323 applied is adjustable as required by the condition of the brushes 360. The controller 350 may also be coupled to the dispenser 330 so as to adjust the amount of cleaning agent 335 dispensed based upon the sensed resiliency.

Figure 4:
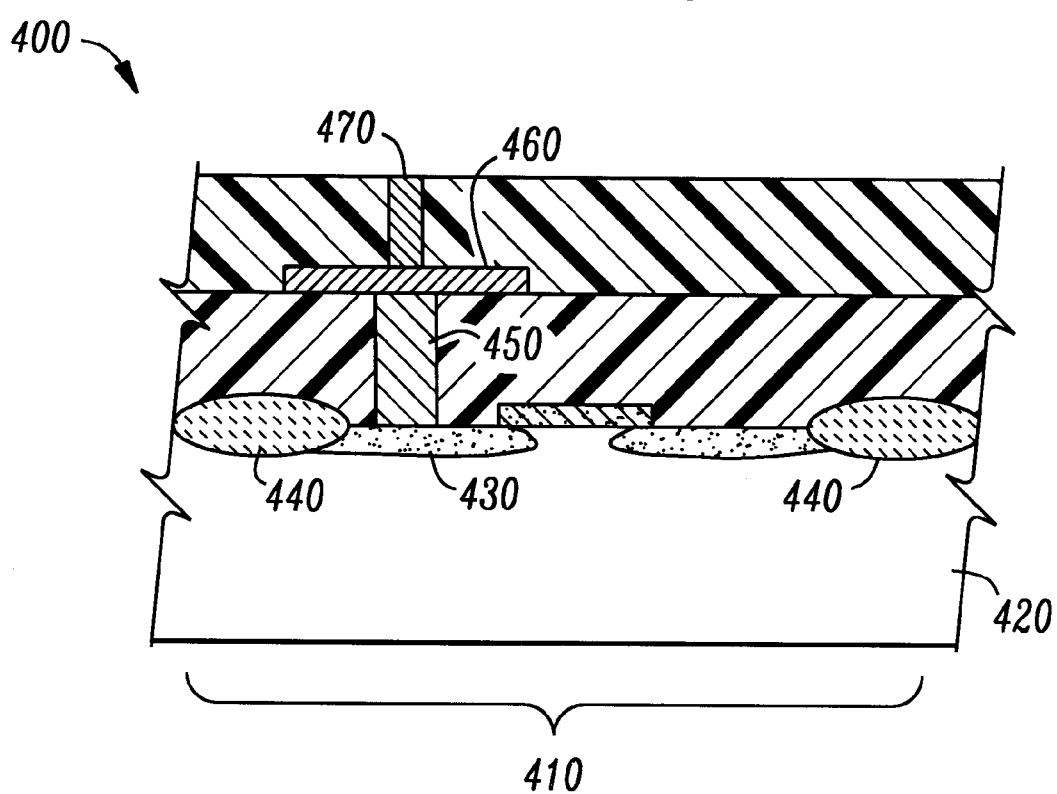
FIG. 4 illustrates a partial sectional view of a conventional integrated circuit that can be manufactured,with the assistance of a cleaning brush manufactured in accordance with the principles of the present invention.

Referring now to FIG. 4, illustrated is a partial sectional view of a conventional integrated circuit 400 that can be manufactured with the assistance of a cleaning brush manufactured in accordance with the principles of the present invention. In this particular sectional view, there is illustrated an active device 410 that comprises a tub region 420, source/drain regions 430 and field oxides 440, which together may form a conventional transistor, such as a complementary metal oxide semiconductor (CMOS), positive channel metal oxide semiconductor (PMOS), negative channel metal oxide semiconductor (NMOS) or bi-polar transistor. A contact plug 450 contacts the active device 410. The contact plug 450 is, in turn, contacted by a trace 460 that connects to other regions of the integrated circuit, which are not shown. A via 470 contacts the trace 460, which provides electrical connection to subsequent levels of the integrated circuit.

Thus, a cleaning brush conditioning apparatus has been described that applies a cleaning agent to the brushes and applies a flexing force to the brushes to maintain a desired brush resiliency. The conditioning apparatus may also comprise a resiliency sensor and a controller that adjusts the amount of cleaning agent and the force applied to the conditioning bars.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit, comprising:

polishing a semiconductor wafer;

cleaning the semiconductor wafer with a cleaning brush;

applying a conditioning bar to the cleaning brush to condition the cleaning brush; and forming and interconnecting active devices on the semiconductor wafer.

2. The method as recited in claim 1 further comprising laser scribing the semiconductor wafer.

3. The method as recited in claim 1 wherein polishing includes chemical/mechanical polishing.

4. The method as recited in claim 1 wherein the conditioning bar is a cylindrical conditioning bar having a longitudinal axis, the conditioning bar capable of rotating about the longitudinal axis.

5. The method as recited in claim 1 wherein the conditioning bar comprises a surface material selected from the group consisting of:

Tetrafluoroethylene;

silicon;

silicon nitride; and silicon carbide.

6. The method as recited in claim 1 further comprising dispensing a cleaning agent to the conditioning bar and to the cleaning brush.

7. The method as recited in claim 6 wherein dispensing includes dispensing a cleaning agent selected from the group consisting of:

deionized water;

ammonium hydroxide; and dilute hydrofluoric acid.

8. The method as recited in claim 1 further comprising:

sensing a resiliency of the cleaning brush; and engaging a load cell when the resiliency is less than a nominal resiliency, the load cell pressing the conditioning bar against the cleaning brush.

9. The method as recited in claim 1 wherein applying includes applying with a variable force.

* * * * *